US012604461B2

(12) United States Patent
Shih et al.

(10) Patent No.: US 12,604,461 B2
(45) Date of Patent: Apr. 14, 2026

(54) DYNAMIC RANDOM ACCESS MEMORY

(71) Applicant: NANYA TECHNOLOGY CORPORATION, New Taipei City (TW)

(72) Inventors: Chiang-Lin Shih, New Taipei City (TW); Yu-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 812 days.

(21) Appl. No.: 17/821,188

(22) Filed: Aug. 21, 2022

(65) Prior Publication Data

US 2024/0064965 A1    Feb. 22, 2024

(51) Int. Cl.
*H10B 12/00*        (2023.01)

(52) U.S. Cl.
CPC ........... *H10B 12/318* (2023.02); *H10B 12/50* (2023.02)

(58) Field of Classification Search
None
See application file for complete search history.

(56) References Cited

U.S. PATENT DOCUMENTS

| | | | |
|---|---|---|---|
| 2006/0186449 A1* | 8/2006 | Uchiyama ............ | H10B 12/033 257/300 |
| 2009/0087958 A1* | 4/2009 | Uchiyama ............ | H10B 12/315 438/387 |
| 2011/0294276 A1* | 12/2011 | Kuroki .................. | H10P 50/283 257/E21.09 |
| 2019/0067298 A1* | 2/2019 | Karda ................... | G11C 11/408 |
| 2019/0295626 A1* | 9/2019 | Ikeda .................... | G11C 11/404 |
| 2020/0279601 A1* | 9/2020 | Kim ..................... | G11C 11/4097 |
| 2022/0359645 A1* | 11/2022 | Lai ........................ | H10B 12/033 |

FOREIGN PATENT DOCUMENTS

| | | |
|---|---|---|
| TW | 201937699 A | 9/2019 |
| TW | 202114192 A | 4/2021 |

* cited by examiner

*Primary Examiner* — Khaja Ahmad
(74) *Attorney, Agent, or Firm* — CKC & Partners Co., LLC

(57) ABSTRACT

A dynamic random access memory includes an array region, a bottom capacitor array located in the array region, and a top capacitor array located in the array region and located on the bottom capacitor array. The bottom capacitor array is single-sided capacitor array. The top capacitor is a double-sided capacitor array.

14 Claims, 5 Drawing Sheets

DYNAMIC RANDOM ACCESS MEMORY

BACKGROUND

Field of Invention

The present invention relates to a dynamic random access memory.

Description of Related Art

Capacitors are used in a wide variety of semiconductor circuits, such as in dynamic random access memory (DRAM) circuits. A DRAM cell includes a metal-oxide semiconductor field effect transistor (MOSFET) and a capacitor, which is an addressable location that can store one bit of data. Stacked capacitors are commonly used capacitors that are stacked, or placed, over an access transistor in a semiconductor device.

Accordingly, how to provide a dynamic random access memory with higher capacitance without making manufacture process more difficult is still one of the develop direction for those in the industry.

SUMMARY

One aspect of the present disclosure provides a dynamic random access memory.

In one embodiment of the present disclosure, the dynamic random access memory includes an array region, a bottom capacitor array located in the array region, and a top capacitor array located in the array region and located on the bottom capacitor array. The bottom capacitor array is single-sided capacitor array. The top capacitor is a double-sided capacitor array.

In one embodiment of the present disclosure, the bottom capacitor array includes multiple bottom capacitor structures, and each of the bottom capacitor structures includes a top electrode, a first dielectric layer surrounded by the top electrode, a bottom electrode surrounded by the first dielectric layer and the top electrode.

In one embodiment of the present disclosure, the top capacitor array includes multiple top capacitor structures, and each of the top capacitor structures includes a top electrode, a second dielectric layer surrounding the top electrode partially, and a bottom electrode surrounding the second dielectric layer partially.

In one embodiment of the present disclosure, the dynamic random access memory further includes multiple landing pads located between the top capacitor array and the bottom capacitor array.

In one embodiment of the present disclosure, the top capacitor array includes multiple top capacitor structures, each of the top capacitor structures includes an end facing the landing pads, and a width of an end of each one of the top capacitor structures is smaller than an average width of each one of the landing pad.

In one embodiment of the present disclosure, the dynamic random access memory further includes a bottom contact located in a periphery region.

In one embodiment of the present disclosure, the bottom contact includes a top side and a bottom side, and a width of the top side is greater than a width of the bottom side.

In one embodiment of the present disclosure, the dynamic random access memory further includes a first top contact located in the periphery region and located above the bottom contact.

In one embodiment of the present disclosure, the first top contact includes a bottom side, the bottom contact includes a top side, and a width of the bottom side of the first top contact is smaller than the width of the top side of the bottom contact.

In one embodiment of the present disclosure, the dynamic random access memory further includes a second top contact located in the array region and connected with the bottom capacitor array.

In one embodiment of the present disclosure, the dynamic random access memory further includes a third top contact located in the array region and connected with the top capacitor array.

Another aspect of the present disclosure is a dynamic random access memory.

In one embodiment of the present disclosure, the dynamic random access memory includes an array region, a bottom capacitor array located in the array region, and a top capacitor structure located in the array region and located on the bottom capacitor array. The bottom capacitor array includes multiple bottom capacitor structures, and each of the bottom capacitor structures includes a top electrode, a dielectric layer surrounded by the top electrode, and a bottom electrode surrounded by the dielectric layer and the top electrode.

In one embodiment of the present disclosure, the top capacitor array includes multiple top capacitor structures, and each of the top capacitor structures includes a top electrode, a second dielectric layer surrounding the top electrode partially, and a bottom electrode surrounding the second dielectric layer partially.

In one embodiment of the present disclosure, the dynamic random access memory further includes multiple landing pads located between the top capacitor array and the bottom capacitor array.

In one embodiment of the present disclosure, the top capacitor array includes multiple top capacitor structures, each of the top capacitor structures includes an end facing the landing pads, and a ratio derived from dividing a width of an end of each one of the top capacitor structures by an average width of each one of the landing pad is in a range from about 0.5 to 0.55.

In one embodiment of the present disclosure, the dynamic random access memory further includes a bottom contact located in the periphery region.

In one embodiment of the present disclosure, the bottom contact includes a top side and a bottom side, and a ratio derived by dividing a width of the top side of the bottom contact by a width of the bottom side of the bottom contact is in a range from about 2 to 3.

In one embodiment of the present disclosure, the dynamic random access memory further includes a first top contact located in the periphery region and located above the bottom contact.

In one embodiment of the present disclosure, the first top contact includes a bottom side, the bottom contact includes a top side, and a width of the bottom side of the first top contact is smaller than the width of the top side of the bottom contact.

In one embodiment of the present disclosure, the dynamic random access memory further includes a second top contact located in the array region and connected with the top electrode of the bottom capacitor array.

In the aforementioned embodiments, by stacking a double-sided capacitor array on a single-sided capacitor array, the total capacitance of the dynamic random access memory can be increased. In addition, since the total capacitance is increased, the bit line sensing margin can be increased and the performance of retention can be improved.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
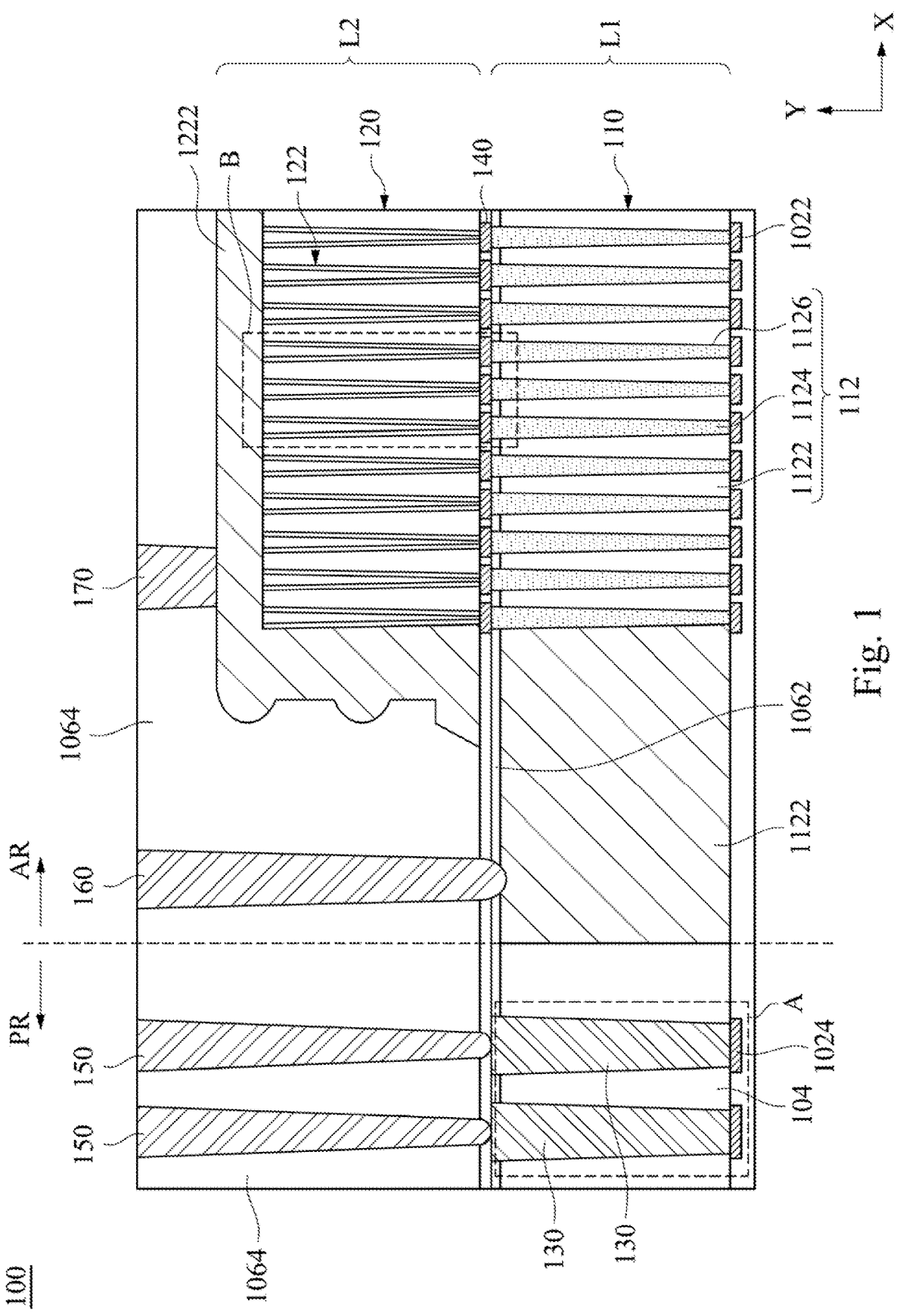
FIG. 1 is a cross-sectional view of a dynamic random access memory according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a dynamic random access memory 100 according to one embodiment of the present disclosure. The dynamic random access memory 100 includes an array region AR and a periphery region PR arranged along a lateral direction X. The dynamic random access memory 100 includes a first layer L1 and a second layer L2 arranged along a longitudinal direction Y. The dynamic random access memory 100 includes a bottom capacitor array 110 in the first layer L1 and a top capacitor array 120 in the second layer. The dynamic random access memory 100 further includes landing pads 140, bottom contacts 130, first top contacts 150, second top contacts 160, and a third top contact 170. The bottom capacitor array 110 and the top capacitor array 120 are located in the array region AR.

The bottom capacitor array 110 and the top capacitor array 120 are located in the array region AR. The bottom capacitor array 110 is a single-sided capacitor array, and the top capacitor array 120 is a double-sided capacitor array. The bottom capacitor array 110 includes multiple bottom capacitor structures 112. The top capacitor array 120 includes multiple top capacitor structure 122. The bottom capacitor structures 112 correspond to the top capacitor structures 122 respectively. Each of the bottom capacitor structures 112 is electrically connected with the corresponding top capacitor structures 122.

Figure 2:
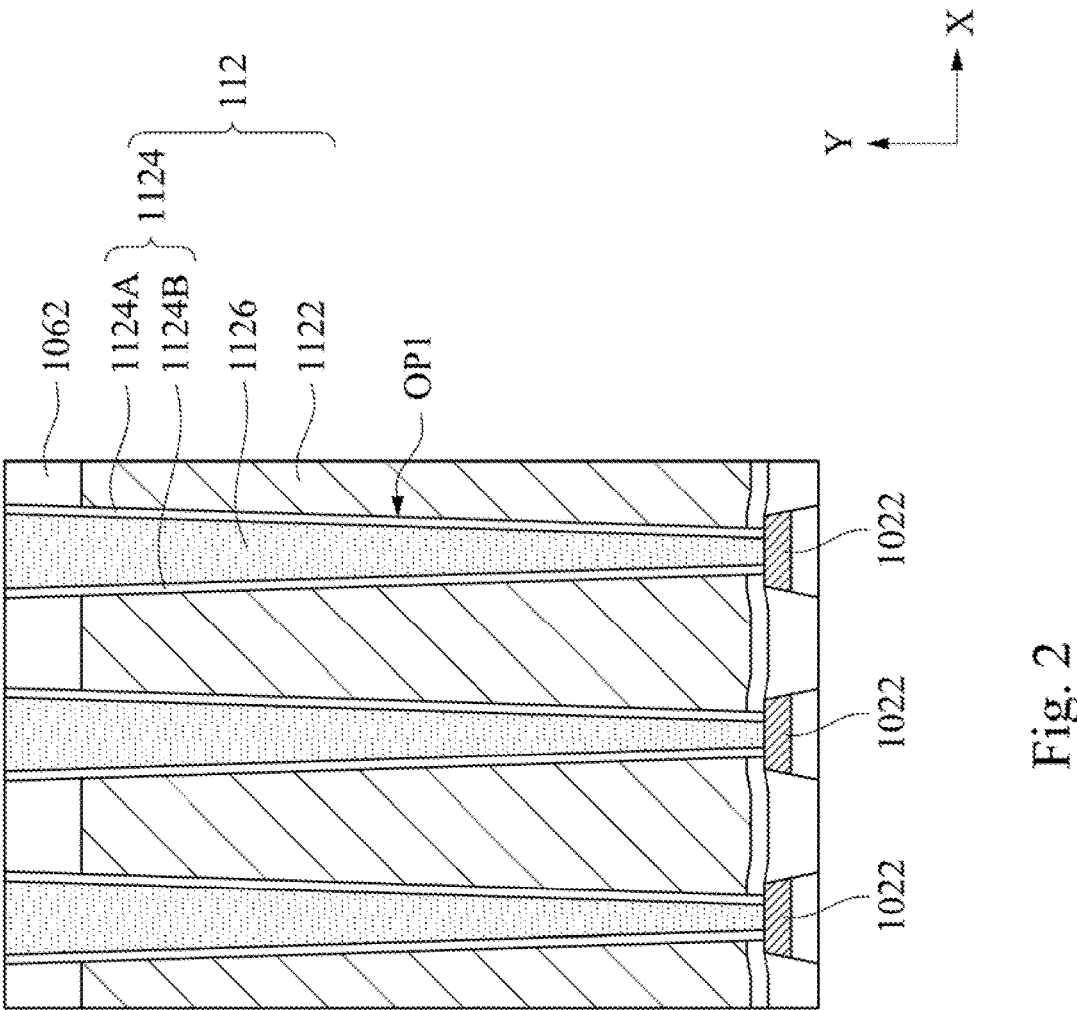
FIG. 2 is an enlarged view of the bottom capacitor array of the dynamic random access memory in FIG. 1.

FIG. 2 is an enlarged view of the bottom capacitor array 110 of the dynamic random access memory 100 in FIG. 1. Each of the bottom capacitor structures 112 includes a top electrode 1122, a first dielectric layer 1124, and a bottom electrode 1126. The first dielectric layer 1124 is a cylinder shell. When viewed in the cross-sectional view, the first dielectric layer 1124 includes two portions 1124A, 1124B collectively surrounded by the top electrode 1122. The top electrodes 1122 of the bottom capacitor structures 112 are connected. In other words, the top electrodes 1122 of the bottom capacitor array 110 is a bulk, and the first dielectric layer 1124 are formed in the top electrode 1122. The bottom electrode 1126 is located between the portions 1124A, 11246 of the first dielectric layer 1124. That is, the bottom electrode 1126 is surrounded by the first dielectric layer 1124 and the top electrode 1122. As such, the capacitance of the bottom capacitor structures 112 is derived according to the outer circle of the first dielectric layer 1124. In other words, the area between two opposite sides of the first dielectric layer 1124 is greater than conventional capacitor structures, and therefore the capacitance of the bottom capacitor array 110 can be increased.

The material of the top electrode 1122 and the bottom electrode 1126 include conductive materials, such as polysilicon or titanium nitride (TiN), but the present disclosure is not limited thereto. In the present embodiment, the material of the top electrode 1122 is polysilicon, and the material of the bottom electrode 1126 is TiN. The first dielectric layer 1124 includes insulative material, such as $Ta_2O_5$, $SrTiO_3$, $Y_2O_3$, $Nb_2O_5$, $ZrO_2$. In the present embodiment, the material of the dielectric layer is zirconium oxide.

The first dielectric layer 1124 and the bottom electrode 1126 of each of the bottom capacitor structures 112 are located above a landing pad 1022. The bottom electrode 1126 of each of the bottom capacitor structure 112 is electrically connected to the landing pads 1022. The landing pads 1022 can ultimately connected with source/drain regions of underlying transistors (not shown). Each of the landing pads 1022 are electrically insulated by Nitride.

Reference is made to FIG. 1. The array region AR of the first layer L1 is filled with polysilicon (top electrode 1122). The periphery region PR of the first layer L1 is filled with an insulating layer 104, and the insulating layer 104 includes interlayer dielectric material such as boro-phospho-silicate glass (BPSG). The insulating layer 104 covers multiple metal layers 1024. An oxide layer 1062 is formed on the insulating layer 104 and the top electrode 1122. The material of the oxide layer 1062 may be Tetraethoxysilane (TEOS).

In the manufacturing process of the first layer L1, the array region AR and the periphery region PR are filled with interlayer dielectric material (e.g., BPSG) first, and therefore the landing pads 1022 and the metal layers 1024 are covered by the interlayer dielectric material. The interlayer dielectric material in the array region AR is removed later, and the top electrode 1122 (e.g., polysilicon) is filled in the array region AR subsequently. Subsequently, an oxide layer 1062 is formed in the array region AR and the periphery region PR. After the oxide layer 1062 is formed to cover the insulating layer 104 and top electrode 1122, multiple holes OP1 are formed in the array region AR. Positions of the holes OP1 correspond to the landing pads 1022, respectively. The landing pads 1022 are exposed from the holes OP1. The first dielectric layer 1124 and the bottom electrode 1126 are subsequently formed in the holes OP1, respectively.

With such structural design, the top electrode 1122 surrounds the first dielectric layer 1124 and the bottom electrode 1126 in the holes OP1, rather than deposited at the bottom of the holes OP1 in a conventional method. Therefore, as mentioned above, the capacitance of the bottom capacitor structures 112 is derived according to the outer circle of the first dielectric layer 1124, and therefore the capacitance of the bottom capacitor array 110 can be increased.

Figure 3:
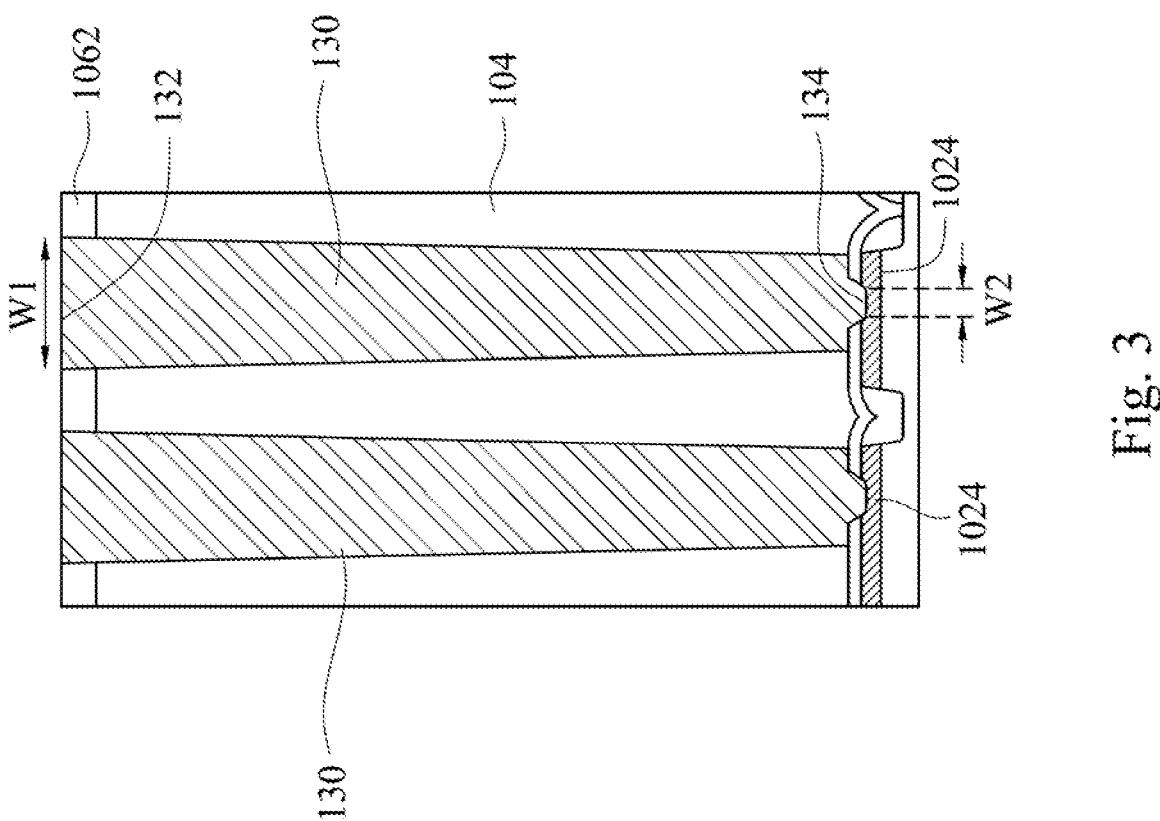
FIG. 3 is an enlarged view of the framed region in FIG. 1.

FIG. 3 is an enlarged view of the framed region A in FIG. 1. The bottom contacts 130 located in the periphery region PR and in the first layer L1. The bottom contacts 130 penetrate through the oxide layer 1062 and the insulating layer 104. The bottom contacts 130 are electrically connected with the metal layers 1024. Each of the metal layers 1024 are electrically insulated by Nitride.

Each of the bottom contacts 130 includes a top side 132 and a bottom side 134. A width W1 of the top side 132 is greater than a width W2 of the bottom side 134. The portions of the bottom contacts 130 close to the metal layer 1024 have funnel shapes. For example, in some embodiments, the width W1 of the top side 132 may be about 150 nm, and the width W2 of the bottom side 134 is reduced to about 50 nm. In other words, in the present embodiment, a ratio derived by dividing the width W1 of the top side 132 of the bottom contact 130 by the width W2 of the bottom side 134 of the bottom contact 130 is in a range from about 2 to 3. With such design, the contact resistance can be reduced.

Figure 4:
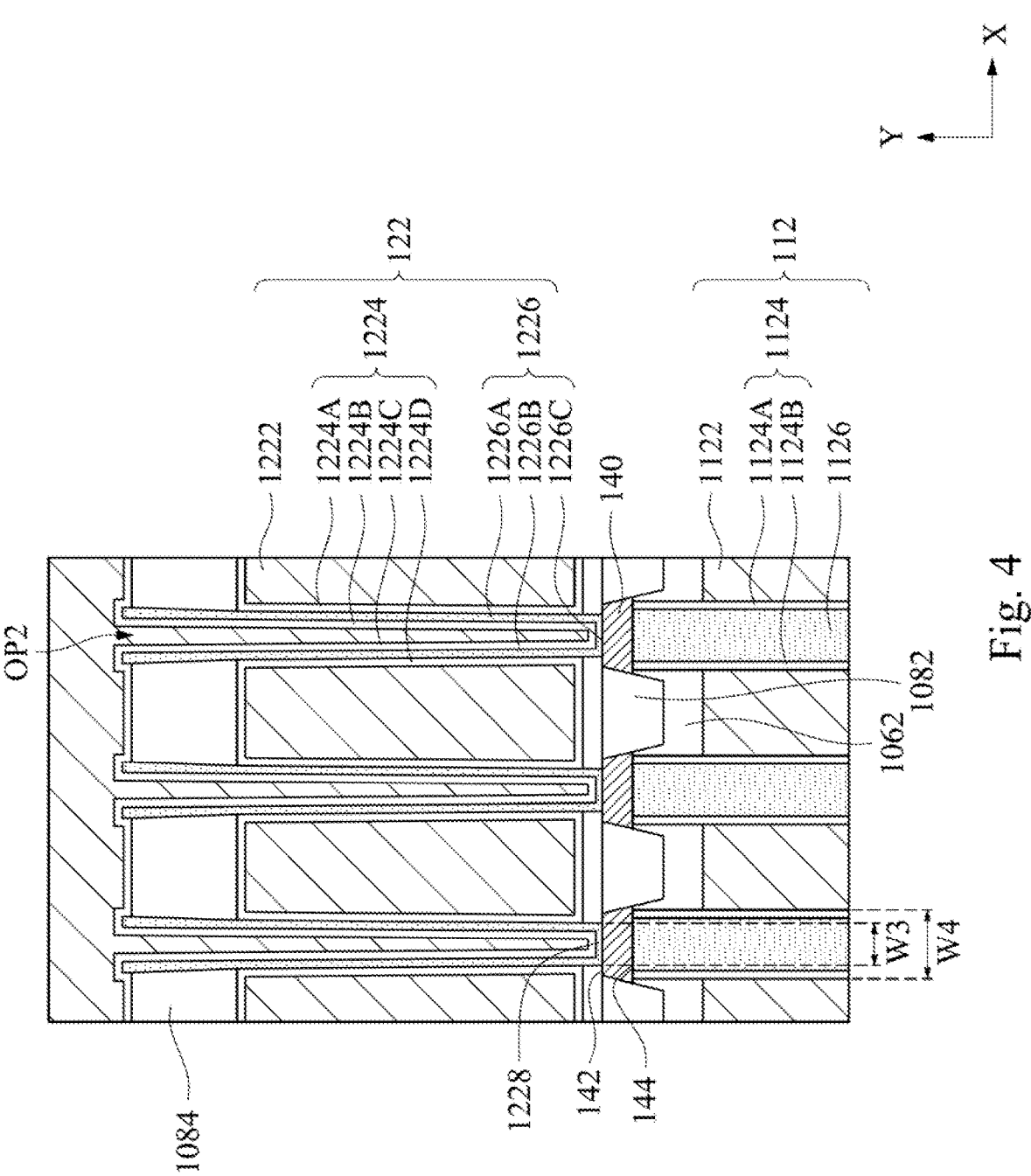
FIG. 4 is an enlarged view of the framed region in FIG. 1.

FIG. 4 is an enlarged view of the framed region B in FIG. 1. Each of the top capacitor structures 122 includes a top electrode 1222, a second dielectric layer 1224, and a bottom electrode 1226. The bottom electrode 1226 of each of the top capacitor structures 122 has a U shape. In other words, the bottom electrode 1226 of each of the top capacitor structures 122 is a cylinder shell with a bottom portion. When viewed in the cross-sectional view, the bottom electrode 1226 includes two portions 1226A, 1226B and a bottom portion 1226C. The second dielectric layer 1224 surrounds opposite sides of the portions 1226A, 1226B of the bottom electrode 1226 and covers the bottom portion 1226C of the bottom electrode 1226. That is, when viewed in the cross-sectional view, the portion 1226A of the bottom electrode 1226 are covered by two portions 1224A, 1224B of the second dielectric layer 1224, and the portion 1226B of the bottom electrode 1226 are covered by two portions 1224C, 1224D of the second dielectric layer 1224. In other words, the bottom electrode 1226 surrounds the second dielectric layer 1224 partially. Specifically, the bottom electrode 1226 surrounds the portion of the second dielectric layer 1224 inside the bottom electrode.

The top electrode 1222 covers the second dielectric layer 1224. Portions of the top electrode 1222 are located in the opening OP2 collectively formed by the bottom electrode 1226 and the second dielectric layer 1224. In other words, when viewed in the cross-sectional view, portions of the top electrode 1222 are located in the space between the portions 1224B, 1224C. That is, the second dielectric layer 1224 surrounds the top electrode 1222 partially. The top electrode 1222 further fills the space between adjacent two top capacitor structures 122. In other words, the top electrode 1222 further fills the space between the portions 1224A, 1224D of adjacent two of the top capacitor structures 122.

As shown in FIG. 4, the dynamic random access memory 100 further includes another insulating layer 1082 and multiple landing pads 140 located between the top capacitor array 120 and the bottom capacitor array 110. The insulating layer 1082 is located on the oxide layer 1062. The landing pads 140 are located on the bottom electrode 1126 and the first dielectric layer 1124 of the bottom capacitor array 110.

Each of the landing pads 140 includes a top side 142 facing the top capacitor array 120 and a bottom side 144 facing the bottom capacitor array 110. Each of the top capacitor structures 122 includes an end 1228 facing the landing pad 140. The end 1228 of the top capacitor structure 122 is substantially the bottom side of the bottom portion 1226C. A width W3 of the end 1228 of the top capacitor array 120 is smaller than the width of the top side 142 of the landing pad 140. For example, in some embodiments, the width W3 of the end 1228 is about 23 nm, and average width W4 of the landing pad 140 is about 43 nm. Specifically, a ratio between the width W3 of the end 1228 of the top capacitor array 120 and the average width W4 of the landing pad 140 is in a range from about 0.5 to 0.55.

In addition, as shown in FIG. 4, the bottom sides 144 and the average width W4 of the landing pads 140 are wider than the bottom capacitor structures 112. For example, in some embodiments, a width of the bottom electrode 1126 of the bottom capacitor structure 112 is about 40 nm. Specifically, a ratio between the average width W4 of the landing pads 140 and a width of the bottom electrode 1126 of the bottom capacitor structure 112 is in a range from about 1.05 to 1.1. As such, the landing pads 140 can provide larger overlay margin between the bottom capacitor structures 112 and the top capacitor structures 122 to avoid misalignment problem between the bottom capacitor array 110 and top capacitor array 120.

Reference is made to FIG. 1. Another oxide layer 1064 covers the top capacitor array 120 in the array region AR and fills the second layer L2 in the periphery region PR. The material of the oxide layer 1064 may be TEOS oxide.

In the manufacturing process of the second layer L2, before the top capacitor array 120 is formed and after the insulating layer 1082 if formed, a TEOS oxide layer and another insulating layer 1084 are formed above the insulating layer 1082 first. Subsequently, the bottom electrodes 1226 of the top capacitor array 120 are formed, and TEOS oxide layer and the insulating layer 1084 are removed. Subsequently, the second dielectric layers 1224 are formed to cover the bottom electrodes 1226 and the remaining insulating layer 1084. The top electrodes 1222 of the top capacitor array 120 are formed to cover the second dielectric layers 1224 and fill the openings OP2. The top electrodes 1222 further fill the space between adjacent two of the top capacitor structures 122.

Figure 5:
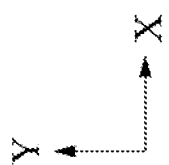
FIG. 5 is an enlarged view of the first top contact of the dynamic random access memory in FIG. 1.
Figure 5:
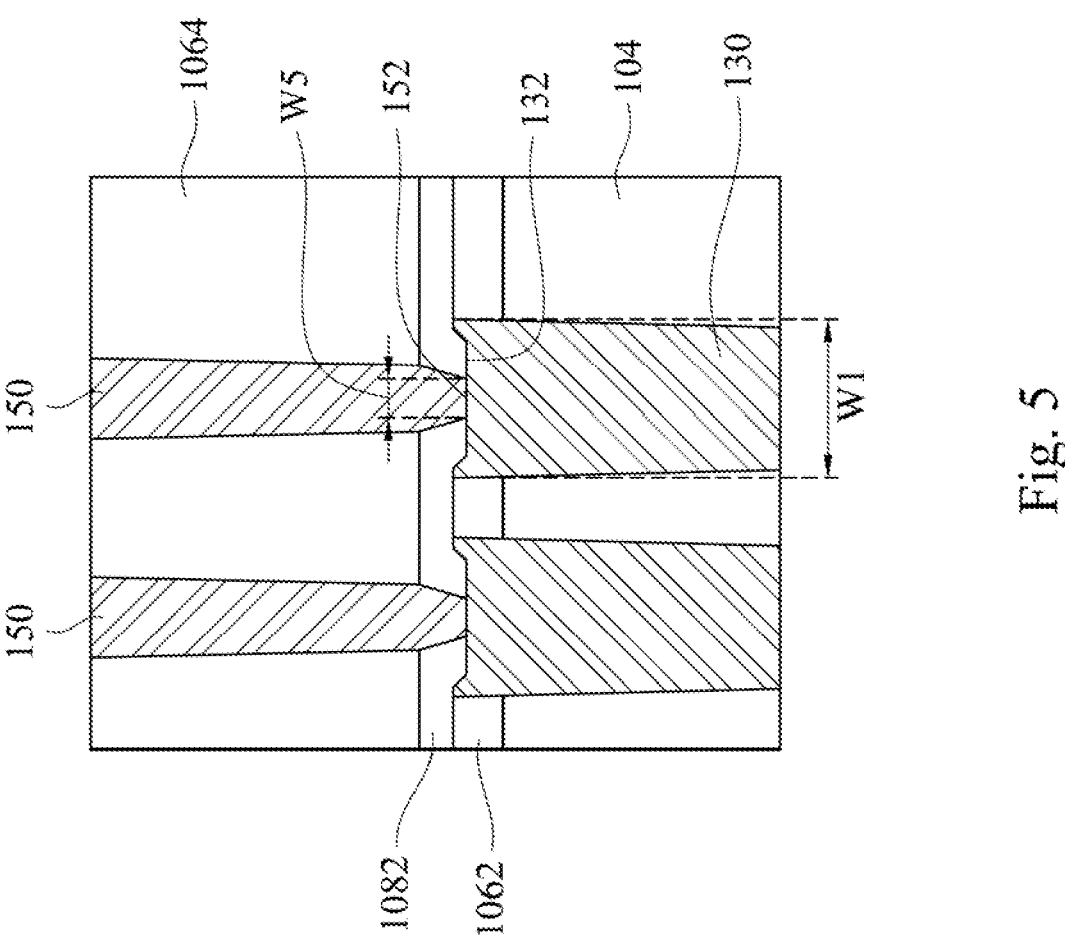

FIG. 5 is an enlarged view of the first top contacts 150 of the dynamic random access memory 100 in FIG. 1. The first top contacts 150 are located in the periphery region PR and in the second layer L2. The first top contacts 150 are located above the bottom contacts 130 and correspond to the bottom contacts 130 respectively. The first top contacts 150 penetrate the oxide layer 1064 and are connected with the bottom contacts 130. Each of the first top contacts 150 includes a bottom side 152. A width W5 of the bottom side 152 of the first top contact 150 is smaller than the width W1 of the top side 132 of the bottom contact 130. As such, it is beneficial to connect the bottom contacts 130 and the first top contacts 150.

Reference is made to FIG. 1. The second top contacts 160 are located in the array region AR and are located above the top electrode 1122 of the bottom capacitor array 110. As shown in FIG. 1, the orthogonal projection of the second top contacts 160 on the top electrode 1122 of the bottom capacitor array 110 is away from the first dielectric layer 1124 and the bottom electrode 1126 of the bottom capacitor structures 112. The second top contacts 160 penetrate the oxide layer 1064 and are electrically connected with the top electrode 1122 of the bottom capacitor array 110.

Reference is made to FIG. 1. The third top contact 170 is located in the array region AR and is located above the top capacitor array 120. The third top contact 170 penetrates the oxide layer 1064 and is electrically connected with the top electrode 1222 of the top capacitor array 120. The orthogonal projection of the third top contact 170 on the top electrode 1222 overlaps the second dielectric layer 1224 and the bottom electrode 1226 (see FIG. 4) of the top capacitor structures 122. Since the second top contacts 160 are electrically connected to the top electrode 1122 and the third top contact 170 is electrically connected to the top electrode 1222, the voltage of the second top contacts 160 and the third contact are substantially the same.

As shown is FIG. 1, the overall capacitor array design in the present disclosure is dual-deck capacitors. Since the bottom capacitor array 110 is a single-sided capacitor array, the bottom electrodes 1226 of the top capacitor array 120 can be electrically connected with the bottom electrodes 1126 of the bottom capacitor array 110. Therefore, by stacking a double-sided capacitor array on a single-sided capacitor array, the total capacitance of the dynamic random access memory 100 can be increased. In addition, since the total capacitance is increased, the bit line sensing margin can be increased and the performance of retention can be improved.

As described above, by stacking a double-sided capacitor array on a single-sided capacitor array, the total capacitance of the dynamic random access memory can be increased. In addition, since the total capacitance is increased, the bit line sensing margin can be increased and the performance of retention can be improved. A width of the top sides of the bottom contacts is greater than a width of the bottom sides of the bottom contacts. With such design, the contact resistance can be reduced. In addition, a width of the bottom side of the first top contact is smaller than the width of the top side of the bottom contact. As such, it is beneficial to connect the bottom contacts and the first top contacts.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A dynamic random access memory, comprising:
an array region;
a bottom capacitor array located in the array region, wherein the bottom capacitor array is single-sided capacitor array;
a top capacitor array located in the array region and located on the bottom capacitor array, wherein the top capacitor array is a double-sided capacitor array, the top capacitor array comprises a plurality of top capacitor structures, and each of the top capacitor structures comprises:
a top electrode;
a second dielectric layer surrounding the top electrode partially; and
a bottom electrode surrounding the second dielectric layer partially, and the bottom electrode of each of the top capacitor structures has a U-shape; and
a plurality of landing pads located between the top capacitor array and the bottom capacitor array, wherein each of the top capacitor structures comprises an end facing the landing pads, and a width of the end of each one of the top capacitor structures is smaller than an average width of each one of the landing pads.

2. The dynamic random access memory of claim 1, wherein the bottom capacitor array comprises a plurality of bottom capacitor structures, and each of the bottom capacitor structures comprises:
a top electrode;
a first dielectric layer surrounded by the top electrode; and a bottom electrode surrounded by the first dielectric layer and the top electrode.

3. The dynamic random access memory of claim 1, further comprising:
a bottom contact located in a periphery region.

4. The dynamic random access memory of claim 3, wherein the bottom contact comprises a top side and a bottom side, and a width of the top side is greater than a width of the bottom side.

5. The dynamic random access memory of claim 3, further comprising:
a first top contact located in the periphery region and located above the bottom contact.

6. The dynamic random access memory of claim 5, wherein the first top contact comprises a bottom side, the bottom contact comprises a top side, and a width of the bottom side of the first top contact is smaller than the width of the top side of the bottom contact.

7. The dynamic random access memory of claim 1, further comprising:
a second top contact located in the array region and connected with the bottom capacitor array.

8. The dynamic random access memory of claim 1, further comprising:
a third top contact located in the array region and connected with the top capacitor array.

9. A dynamic random access memory, comprising:
an array region;
a bottom capacitor array located in the array region, wherein the bottom capacitor array comprises a plurality of bottom capacitor structures, and each of the bottom capacitor structures comprises:
a top electrode;
a dielectric layer surrounded by the top electrode; and
a bottom electrode surrounded by the dielectric layer and the top electrode;
a top capacitor array located in the array region and located on the bottom capacitor array, the top capacitor array comprises a plurality of top capacitor structures, and each of the top capacitor structures comprises:
a top electrode;
a second dielectric layer surrounding the top electrode partially; and
a bottom electrode surrounding the second dielectric layer partially, and the bottom electrode of each of the top capacitor structures has a U-shape; and
a plurality of landing pads located between the top capacitor array and the bottom capacitor array, wherein each of the top capacitor structures comprises an end facing the landing pads, and a ratio derived from dividing a width of the end of each one of the top capacitor structures by an average width of each one of the landing pad is in a range from about 0.5 to 0.55.

10. The dynamic random access memory of claim 9, further comprising:
a bottom contact located in a periphery region.

11. The dynamic random access memory of claim 10, wherein the bottom contact comprises a top side and a bottom side, a ratio derived by dividing a width of the top side of the bottom contact by a width of the bottom side of the bottom contact is in a range from about 2 to 3.

12. The dynamic random access memory of claim 10, further comprising:
a first top contact located in the periphery region and located above the bottom contact.

13. The dynamic random access memory of claim 12, wherein the first top contact comprises a bottom side, the bottom contact comprises a top side, and a width of the bottom side of the first top contact is smaller than the width of the top side of the bottom contact.

14. The dynamic random access memory of claim 9, further comprising a second top contact located in the array region and connected with the top electrode of the bottom capacitor array.

* * * * *